United States Patent
Choi et al.

(10) Patent No.: US 8,111,005 B2
(45) Date of Patent: Feb. 7, 2012

(54) VOLTAGE SUPPLY MODULE AND BACKLIGHT ASSEMBLY HAVING THE SAME

(75) Inventors: Min-Soo Choi, Cheonan-si (KR); Jae-Eun Um, Cheonan-si (KR)

(73) Assignee: Samsung Electronics Co., Ltd (KR)

( * ) Notice: Subject to any disclaimer, the term of this patent is extended or adjusted under 35 U.S.C. 154(b) by 409 days.

(21) Appl. No.: 12/335,299

(22) Filed: Dec. 15, 2008

(65) Prior Publication Data

US 2009/0184667 A1  Jul. 23, 2009

(30) Foreign Application Priority Data

Jan. 21, 2008 (KR) ........................ 10-2008-0006168

(51) Int. Cl.
*H05B 37/02* (2006.01)
(52) U.S. Cl. ......... 315/291; 315/224; 315/297; 315/312
(58) Field of Classification Search .................. 315/224, 315/276–278, 282, 291, 294, 297, 307, 312; 345/102
See application file for complete search history.

(56) References Cited

U.S. PATENT DOCUMENTS

| | | | |
|---|---|---|---|
| 6,570,344 B2 * | 5/2003 | Lin ................................ | 315/224 |
| 6,960,891 B2 * | 11/2005 | Park et al. ..................... | 315/229 |
| 7,358,682 B2 * | 4/2008 | Matsushima .................. | 315/239 |
| 7,683,555 B2 * | 3/2010 | Hiramatsu ..................... | 315/255 |
| 7,830,100 B2 * | 11/2010 | Mi et al. ........................ | 315/291 |
| 2006/0038466 A1 * | 2/2006 | Nakatsuka et al. ........... | 310/359 |
| 2006/0197466 A1 * | 9/2006 | Park .............................. | 315/224 |
| 2006/0254502 A1 | 11/2006 | Garrou et al. | |
| 2007/0057344 A1 | 3/2007 | Lee | |
| 2007/0236640 A1 * | 10/2007 | Kimura ......................... | 349/141 |
| 2007/0252535 A1 * | 11/2007 | Fukumoto et al. ............ | 315/291 |
| 2010/0014019 A1 * | 1/2010 | Yun ............................... | 349/61 |

FOREIGN PATENT DOCUMENTS

| | | |
|---|---|---|
| JP | 2007-134290 | 5/2007 |
| KR | 1020050060233 A | 6/2005 |
| KR | 1020050073814 A | 7/2005 |
| WO | 2006054601 A1 | 5/2006 |
| WO | 2007125839 A1 | 11/2007 |

OTHER PUBLICATIONS

European Patent Office, Extended European Search Report EP 09 00 0027, Aug. 31, 2011, 6 pages, Munich, Germany.

* cited by examiner

*Primary Examiner* — Tung X Le
(74) *Attorney, Agent, or Firm* — Innovation Counsel LLP (57) ABSTRACT

In a voltage supply module and a backlight assembly having the same, a converter is disposed on a first face of a board and converts basic voltage into driving voltage. A capacitor includes at least one first electrode connected to an output line of the converter and at least one second electrode disposed to be spaced apart from the first electrode along a direction substantially parallel with the first face. A plurality of the second electrodes are disposed on the board between the first electrodes. The first and second electrodes form a ballast capacitance.

19 Claims, 9 Drawing Sheets

VOLTAGE SUPPLY MODULE AND BACKLIGHT ASSEMBLY HAVING THE SAME

CROSS-REFERENCE TO RELATED APPLICATIONS

This application claims priority under 35 U.S.C. §119 to Korean Patent Application No. 10-2008-6168, filed on Jan. 21, 2008 in the Korean Intellectual Property Office (KIPO), the contents of which are incorporated herein by reference in their entirety.

BACKGROUND OF THE INVENTION

1. Field of the Invention

The present invention relates to a voltage supply module and a backlight assembly having the same. More particularly, the present invention relates to a voltage supply module providing electrical voltage with a light source of a display device and backlight assembly having the voltage supply module.

2. Description of the Related Art

Flat panel display devices have various advantages such as slim size, low weight and low voltage consumption. Thin-film transistor liquid crystal display (TFT-LCD) devices are capable of displaying high quality images, and the TFT-LCD devices have been developed to provide image display quality substantially equivalent to cathode ray tube (CRT) devices. LCD devices have been widely used, and plasma display panel (PDP) devices have also been used in various fields.

A display panel of a LCD device displays an image using light that is provided from the exterior. The LCD device includes a backlight assembly providing a rear face of the display panel with light.

The backlight assembly is classified as either a direct illumination type or an edge illumination type in accordance with the position of a light source. In the direct illumination type, the light source such as a lamp is directly disposed on the rear face of the display panel. In the edge illumination type, the light source is disposed on a side face of a light guide plate disposed on the rear face of the display panel.

A backlight assembly of the direct illumination type includes a large number of light sources. Cold cathode fluorescent lamps (CCFLs) have been widely used as the light sources. Various electrical elements are disposed on an inverter so that the lamps are stably driven. The inverter typically includes a transformer and a ballast capacitor stabilizing the driving voltage provided from the transformer. Ceramic capacitors have been widely used as ballast capacitors.

The number of parts, the volume and weight of backlight assemblies have been decreased, and assembling efficiency levels for the backlight assemblies have been improved. According to such trends, technologies related to an inverter that does not include a ceramic capacitor have been developed.

When an electrical element such as the ceramic capacitor, however, is omitted, an element providing the function of a ballast capacitor is required in the inverter.

Also, as the display device becomes larger, the length of the lamp or lamps becomes longer so that an initial discharge voltage required for the lamp becomes much higher. Thus, when an electrical element such as the ceramic capacitor, which stabilizes the driving voltage of a high voltage, is omitted, the stability of the inverter may be deteriorated.

SUMMARY OF THE INVENTION

The present invention provides a voltage supply module which decreases the number of parts and increases electrical stability.

Also, the present invention provides a backlight assembly having the voltage supply module.

According to one aspect of the present invention, a voltage supply module includes a board, a converter and a capacitor.

The board includes a first face and a second face opposite the first face. The converter is operative to convert externally provided first voltage into second voltage. A capacitor forms a ballast capacitance stabilizing the second voltage. The capacitor includes a plurality of first electrodes and second electrodes. The first electrodes are disposed on the first face to be connected to an output line of the converter. The second electrodes are disposed on the first face or the second face. The plurality of second electrodes are interspersed between the first electrodes. The second electrodes are spaced apart from the first electrodes along a plane substantially parallel with a plane of the first face.

In an example embodiment, the second electrodes may be disposed on the second face. The first electrodes extend from the output line. End portions of the second electrodes may be electrically connected with each other. The second electrodes may extend toward the output line and may be disposed substantially parallel with each other. The first electrodes and the second electrodes may extend along a straight line. Alternatively, the first electrodes and the second electrodes may be bent and extend substantially parallel with each other.

The voltage supply module may further include a sensing line. The sensing line is disposed on the second face and electrically connected to the second electrodes and transmits sensing signals including signals corresponding to the state of the second voltage to a protection circuit for protecting the voltage supply module.

In another example embodiment, the second electrodes may be disposed on the first face. The voltage supply module may further include a sensing line. The sensing line is disposed on the first face and electrically connected to the second electrodes and transmits sensing signals including signals corresponding to the state of the second voltage to a protection circuit for protecting the voltage supply module.

A plurality of the output lines may extend from the converter and the capacitor is electrically connected with each of the output lines. The voltage supply module may include a plurality of the converters.

According to another aspect of the present invention, a backlight assembly includes a lamp and a voltage supply module.

The lamp includes a lamp tube, a first terminal and a second terminal disposed on the lamp tube.

The voltage supply module includes a board, a converter and a capacitor. The board includes a first face and a second face opposite to the first face. The converter is operative to convert externally provided first voltage into second voltage. The capacitor includes a plurality of the first and second electrodes. The first electrodes are disposed on the first face and connected in parallel with an output line of the converter. The second electrodes are interspersed between the first electrodes and are spaced apart from the first electrodes along a plane substantially parallel with a plane of the first face.

The second terminal of the lamp may be grounded. A plurality of the lamps may be electrically connected to a plurality of the output lines, respectively. The capacitor may be electrically connected in parallel with each of the output lines.

The first electrodes may be electrically connected in parallel with the output line of the converter and the second electrodes may be disposed to alternate with the first electrodes. The second electrodes are disposed on the second face between the first electrodes. Alternatively, the second electrodes are disposed on the first face between the first electrodes.

In one example embodiment, each of the first electrodes extends from the output line and may be bent to have a V-shape and each of the second electrodes is disposed between the first electrodes to have a V-shape.

In another example embodiment, each of the first electrodes may turn around a center of rotation defined on the first face so that an end portion of the first electrode approaches the center of rotation and the second electrode turns around the center of rotation so as not to overlap with the first electrode so that an end portion of the second electrode approaches the center of rotation.

The voltage supply module may further include a sensing line. The sensing line is electrically connected to the second electrodes and transmits sensing signals including signals corresponding to the state of the lamp second voltage to a protection circuit for protecting the backlight assembly.

According to the voltage supply module and the backlight assembly having the same, the ballast capacitance is formed by linear patterns such as the first and second electrodes so that an additional element such as ceramic capacitors for forming the ballast capacitance and for feeding back the second voltage may be omitted.

Also, the first and second electrodes are spaced apart from each other along the horizontal direction so that the insulation breakdown voltage of the first and second electrodes may be much higher than the discharge voltage of the lamp. As a result, the electrical stability of the voltage supply module may be much improved and the electrical stability of the backlight assembly, which is driven by high voltage according to trends of one-side driving and larger module sizes, may also be improved.

BRIEF DESCRIPTION OF THE DRAWINGS

The above and other features and advantages of the present invention will become more apparent in light of the detailed example embodiments thereof with reference to the accompanying drawings, in which.

DESCRIPTION OF THE EMBODIMENTS

The present invention is described more fully hereinafter with reference to the accompanying drawings, in which embodiments of the invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be on, connected to or coupled to the other element or layer, with intervening elements or layers present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to limit of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
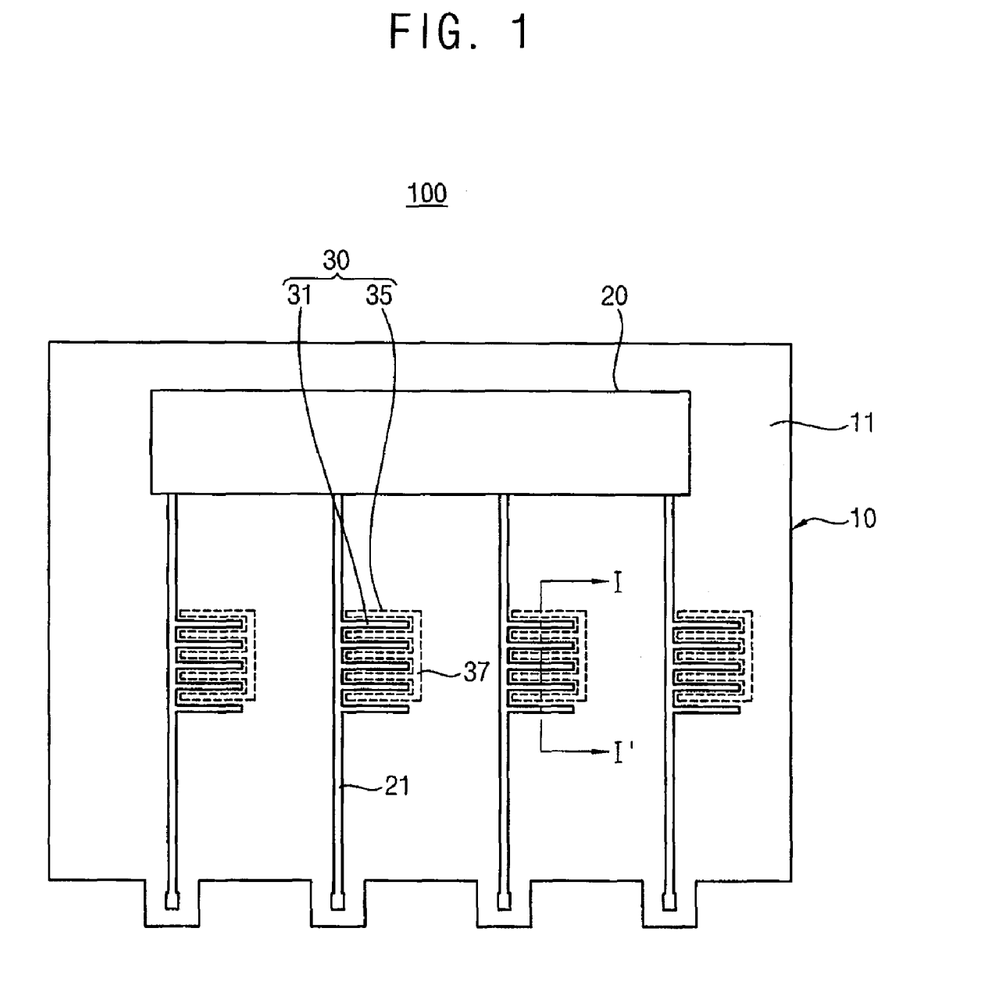
FIG. 1 is a plan view illustrating a voltage supply module in accordance with an embodiment of the present invention.
Figure 2:
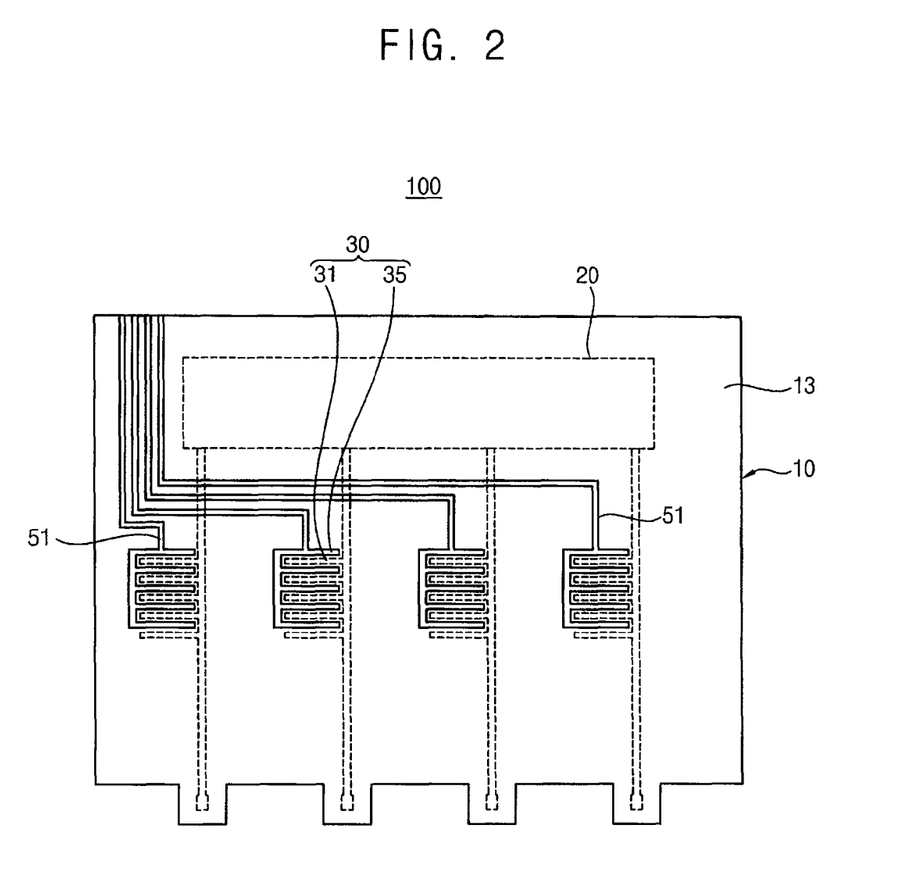
FIG. 2 is a plan view illustrating a rear face of the voltage supply module in FIG. 1.

FIG. 1 is a plan view illustrating a voltage supply module in accordance with an embodiment of the present invention. FIG. 2 is a plan view illustrating a rear face of the voltage supply module in FIG. 1.

Referring to FIGS. 1 and 2, a voltage supply module 100 may supply driving voltage to a light source of a display device. The voltage supply module 100, for example, supplies lamp driving current to a light source such as a cold cathode fluorescent lamp (CCFL). The voltage supply module 100 includes a board 10, a converter 20 and a capacitor 30.

The board 10 may include a printed circuit board (PCB). The board 10 is formed of an insulating material which has a relative permittivity of about 4 to 5. The board 10 is a flat plate which may have a rectangular shape as illustrated in FIGS. 1 and 2. The board 10 includes a first face 11 and a second face 13 opposite to each other. The second face 13 may be a lower face facing a ground surface. The first face 11 may be an upper face opposite to the second face 13.

The converter 20 may be disposed on the first face 11 or the second face 13. In an example embodiment, the converter 20 is disposed on a long side of the first face 11. Externally provided basic voltage is applied to the converter 20. The converter 20 converts the basic voltage into driving voltage suitable for the light source. Thus, the converter 20 may include a transformer. The transformer may be a boosting transformer. Thus, the voltage level of the driving voltage may be higher than that of the basic voltage.

The converter 20 includes output lines 21 outputting the driving voltage. The output lines 21 may extend from the long side to an edge of another long side of the first face 11.

The voltage supply module 100 may include a plurality of the converters 20 for driving a plurality of the light sources.

Each of the converters 20 may further include an input terminal applied to the basic voltage and output terminals connected to the output lines 21, respectively.

The capacitor 30 includes a plurality of first electrodes 31 and a plurality of second electrodes 35.

The first and second electrodes 31 and 35 may be formed on the first face 11 by printing a linear pattern on the first face 11, or may be formed by forming a thin metal layer on the first face 11 and patterning the thin metal layer, etc.

The first electrodes 31 extend from each of the output lines 21. One first electrode 31 or a plurality of first electrodes 31 may extend from one output line 21. The first electrode 31 may have various shapes such as a line shape, a triangular shape, or a maze shape. In an example embodiment, the first electrodes 31 having the line shape extend from the output line 21 along a direction substantially perpendicular to the extension direction of the output line 21. The first electrodes 31 are spaced apart at regular intervals from each other.

Figure 3:
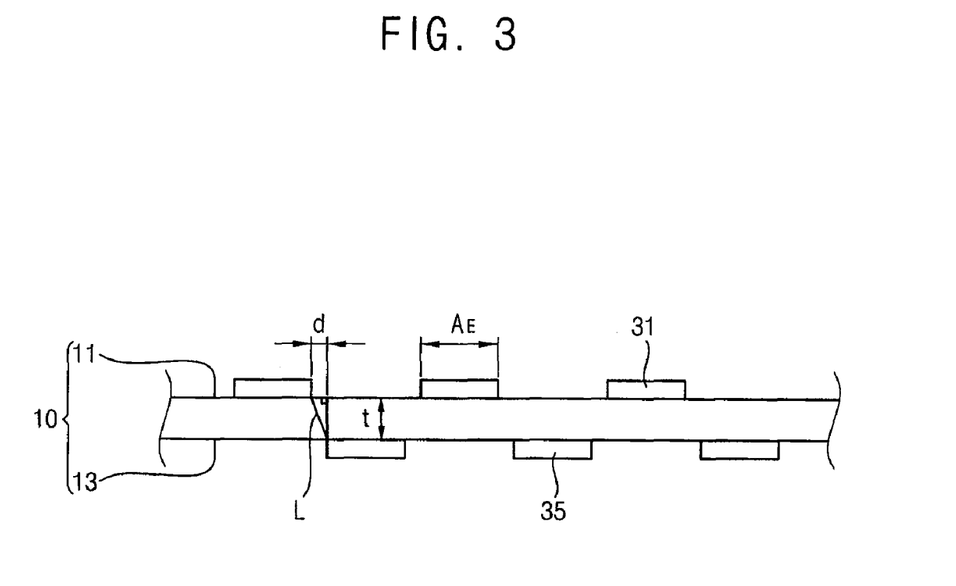
FIG. 3 is a cross-sectional view illustrating the voltage supply module taken along a line I-I' in FIG. 1.

FIG. 3 is a cross-sectional view illustrating the voltage supply module 100 taken along a line I-I' in FIG. 1.

Referring to FIGS. 1 to 3, the second electrodes 35 are disposed on the second face 13 of the board 10 so as not to overlap with the first electrodes 31. Taking a view of the first face 11 along a vertical direction perpendicular to the first face 11, the first electrodes 31 do not overlap with the second electrodes 35. Thus, the first electrodes 31 and the second electrodes 35 are not opposite to each other. In an example embodiment, the second electrodes 35 are disposed on the second face 13 between the first electrodes 31.

The capacitor 30 may further include a connection electrode 37. The connection electrode 37 may be disposed on the second face 13 to be substantially parallel with the output line 21 and to be spaced apart about a length of the second electrode 35 from the output line 21. The second electrodes 35 extend from the connection electrode 37 along a direction perpendicular to an extension direction of the connection electrode 37 to be disposed between the first electrodes 31.

The voltage supply module 100 may further include a sensing line 51. The sensing line 51 is disposed on the second face 13 so as not to overlap with the first electrode 31 and is electrically connected to the second electrode 35, and may be electrically connected to a protection circuit for protecting the voltage supply module 100.

The driving voltage applied to the first electrode 31 may be alternating current (AC) voltage. An induced voltage having a phase difference of 180 degrees with respect to the driving voltage may be formed in the second electrode 35 due to the driving voltage applied to the first electrode 31.

The induced voltage may include signals related to the voltage of the driving voltage applied to the first electrode 31. The signals related to the voltage of the driving voltage may include signals related to the waveform of the driving voltage. Thus, the sensing line 51 may transmit the signals related to the driving voltage to the protection circuit. The protection circuit may protect the voltage supply module 100 based on the signals related to the driving voltage.

Thus, in accordance with example embodiment, an additional element such as a ceramic capacitor for feedback of the signals related to the driving voltage may be omitted from the voltage supply module 100 because the signals related to the driving voltage may be sensed from the induced voltage in the second electrode 35.

When, a thickness of the board 10 is t, a horizontal distance between adjacent edges of the first and second electrodes 31 and 35 along a horizontal direction substantially parallel with the first face 11 is d, and a shortest distance between the first and second electrodes 31 and 35 is L, which is expressed as $L=\sqrt{t^2+d^2}$.

Figure 4:
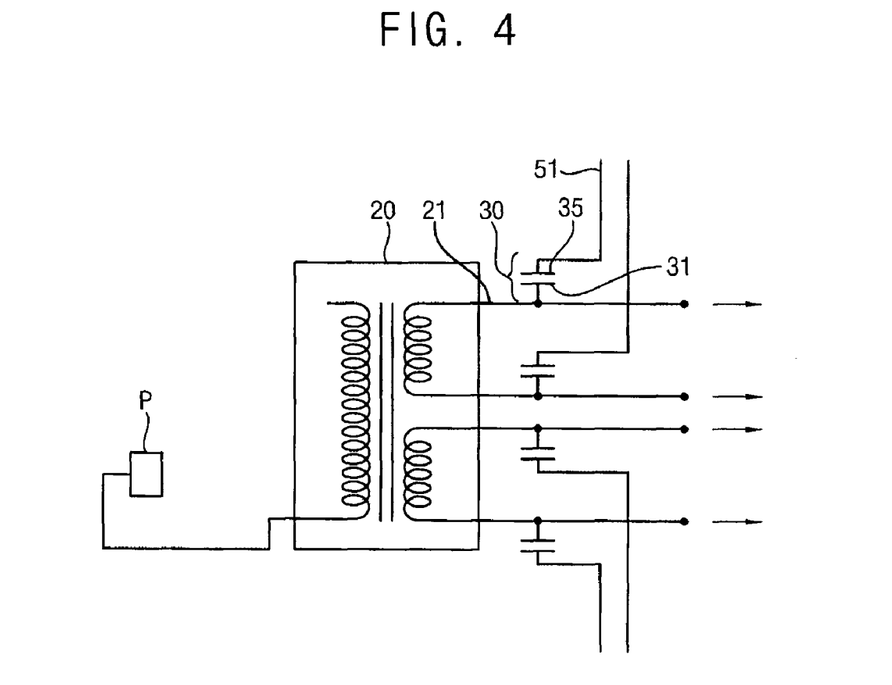
FIG. 4 is an equivalent circuit diagram for the voltage supply module in FIG. 1.

FIG. 4 is an equivalent circuit diagram for the voltage supply module 100 in FIG. 1.

Referring to FIGS. 3 and 4, when the basic voltage is applied to the input terminal of the converter 20, the driving voltage which is boosted in accordance with a turn ratio between the input and the output terminal is outputted from the output terminal. The driving voltage is applied to the light source through the output line 21.

Since a dielectric material, such as the board 10, is disposed between the first and second electrodes 31 and 35 and the driving voltage is applied to the first electrode 31, the capacitor 30 forms a ballast capacitance for stabilizing the driving voltage.

The ballast capacitance may be expressed as $C=\in A/L=\in A/\sqrt{t^2+d^2}$. The $\in$ is the relative permittivity of the board 10, the A is a total area of the first electrodes 31 or the second electrodes 35 and the L is the shortest distance between the first and second electrodes 31 and 35 as mentioned above.

If the first and second electrodes 31 and 35 were to overlap with each other along the vertical direction, the shortest distance between the first and second electrodes 31 and 35 would be d. When the second electrodes 35 are disposed between the first electrodes 31 and there is no overlap in the vertical direction, the shortest distance between edges of the first and second electrodes 31 and 35 of the voltage supply module 100 is L, which is longer than d, then the ballast capacitance may be decreased. When the number of the first and second electrodes 31 and 35 is increased, the total area A of the first electrodes 31 or the second electrodes 35 is increased so that a decrement of the ballast capacitance due to an increment of the shortest distance may be compensated.

Figure 5:
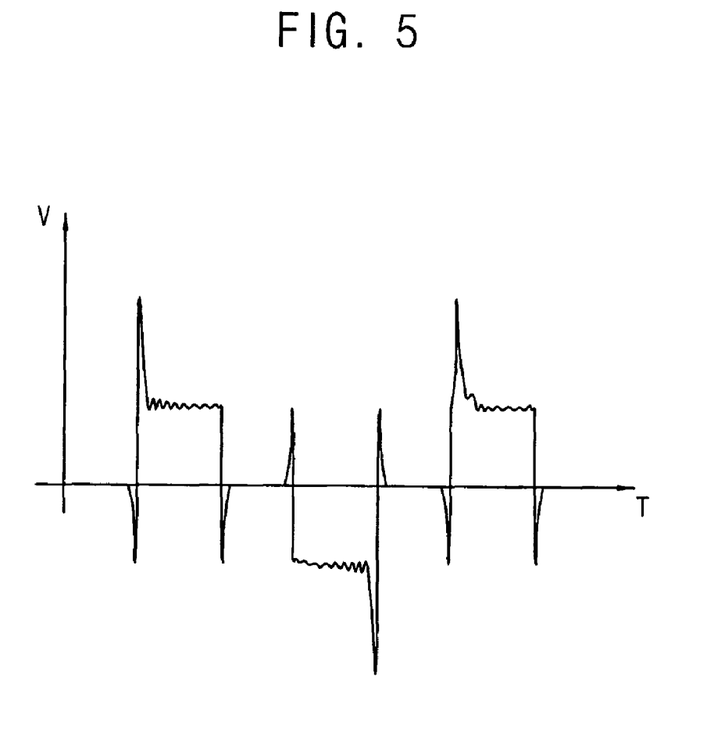
FIG. 5 is a waveform diagram of driving voltage as a function of time provided by the converter.

FIG. 5 is a waveform diagram of driving voltage provided by the converter 20.

Referring to FIG. 5, the basic voltage, sometimes referred to as the driving voltage, applied to the converter 20 may be AC voltage. Thus, the driving voltage outputted from the converter 20 is AC voltage as illustrated in FIG. 5. The driving voltage may include noise and overshoots so that the waveform of the driving voltage may include peak points as shown in FIG. 5. When the driving voltage is directly provided to a light source such as the CCFL, the waveform of the driving voltage is irregular and unstable so that the light source may be irregularly operated and the lifetime of the light source may be reduced.

Figure 6:
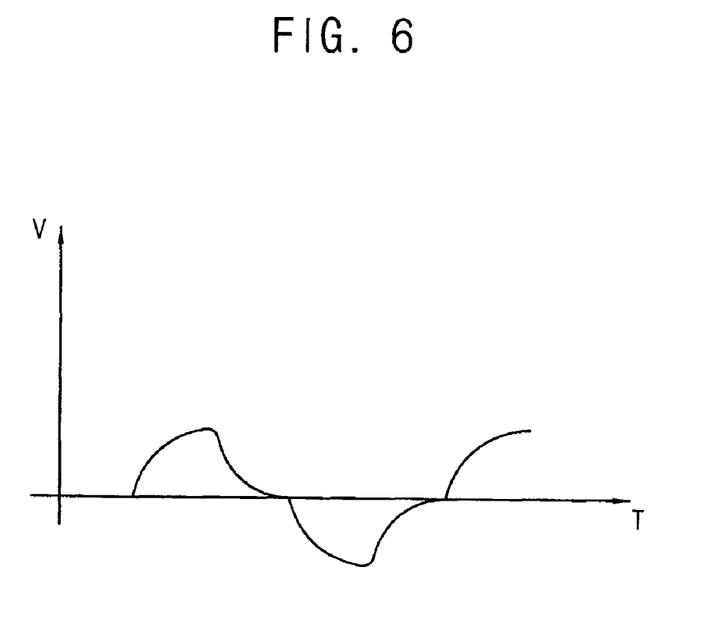
FIG. 6 is a waveform diagram of driving voltage as a function of time which is stabilized by the capacitor in FIG. 4.

FIG. 6 is a waveform diagram of a driving voltage which is stabilized by the capacitor 30 in FIG. 4.

Referring to FIG. 6, the capacitor 30 may remove the noise and the overshoots to output a driving voltage having a stable waveform.

In accordance with example embodiment of the present invention, the capacitor 30 which stabilizes the waveform of the driving voltage may be formed using metal wire patterns such as the first and second electrodes 31 and 35 formed on the board 10. Thus, an additional element such as a ceramic capacitor for implementing a ballast capacitance may be omitted from the voltage supply module 100.

As display devices become larger, light sources such as lamps included in the display devices also become larger. Thus, lamp driving voltages, that is, discharge voltages at terminals of lamps also become higher.

A one-sided driving method in which the driving voltage is applied to one side terminal of the lamp may be preferred for reducing the number of parts such as an inverter, a lamp connector, or a wire. When the lamp is driven by the one-side driving method, the discharge voltage may be much higher than the discharge voltage of a both-side driving method in which the driving voltage is applied to both side terminals of the lamp. Thus, the driving voltage in the one-sided driving method may have voltage higher than that of the both-sided driving method.

Considering a high magnitude of the driving voltage, the noise and the overshoots, the voltage of the driving voltage applied to the first electrode 31 may be higher than an insulation breakdown voltage. When the insulation breakdown voltage is applied to the first electrode 31, corona discharge may occur at an edge of the first electrode 31 toward air around the first electrode 31. When the corona discharge may occur at the first electrode 31, an insulation of the board 10 may be broken down so that a fire may occur at the board 10.

In accordance with example embodiment of the present invention, the first and second electrodes 31 and 35 are disposed so as not to overlap with each other so that the insulation breakdown voltage in which the corona discharge occur may be increased.

When the board 10 having insulating properties is disposed between the first and second electrodes 31 and 35, the insulation breakdown voltage may be calculated using the expression of Paschen's Law such as Vbd=720(t/$\in$') 0.46. Vbd (Vrms) represents a starting voltage of the corona discharge. t (mils) is the thickness of dielectric material. $\in$' is the relative permittivity of the dielectric material.

The board 10 which is generally employed in the voltage supply module 100 may be a CEM-3 type or an FR-4 type. A CEM-3 board or an FR-4 board has a relative permittivity of about 4 to 5. Thus, a relative permittivity of the board 10 may be supposed about 4. The thickness of the board 10 generally used in the voltage supply module 100 may be 1.6 mm, equal to 63 mils.

When the first and second electrodes 31 and 35 are disposed such that they overlap with each other along the vertical direction, t in the expression of Paschen's Law is the same as the thickness of the board 10. Thus, when $\in$'=4 and t=63, Vdd=5216 V from the expression of Paschen's Law.

An initial discharge voltage of a lamp which is typically used as a backlight in a display device, such as a 52-inch television, may be about 4,000 V. When the noise and overshoots are added to the initial discharge voltage about 4,000 V, a voltage over 5,000 V may be applied to the first electrode 31 so that the corona discharge may occur at the first electrode 31.

In an example embodiment of the present invention, the second electrodes 35 are disposed between the first electrodes 31. Thus t in the expression of Paschen's Law is the same as the shortest distance, $L=\sqrt{t^2+d^2}$.

For example, when the horizontal distance d between the first and second electrodes 31 and 35 along the horizontal direction is 37 mils, d=37 mils (=0.9 mm), $t=L=\sqrt{t^2+d^2}=73$ mils. When $\in$'=4 and t=73 mils, the starting voltage of the corona discharge, Vdd=about 6,000 V from the expression of Paschen's Law.

Thus, when the first and second electrodes 31 and 35 are disposed so as not to overlap with each other along the vertical direction and disposed to be spaced somewhat apart from each other along the horizontal direction, the insulation breakdown voltage of the board 10 may be greatly increased.

As a result, according to the present invention, in spite of a trend of increasing discharge voltages, the noise and the overshoots as mentioned above, the electrical stability of the voltage supply module 100 may be much improved.

Figure 7:
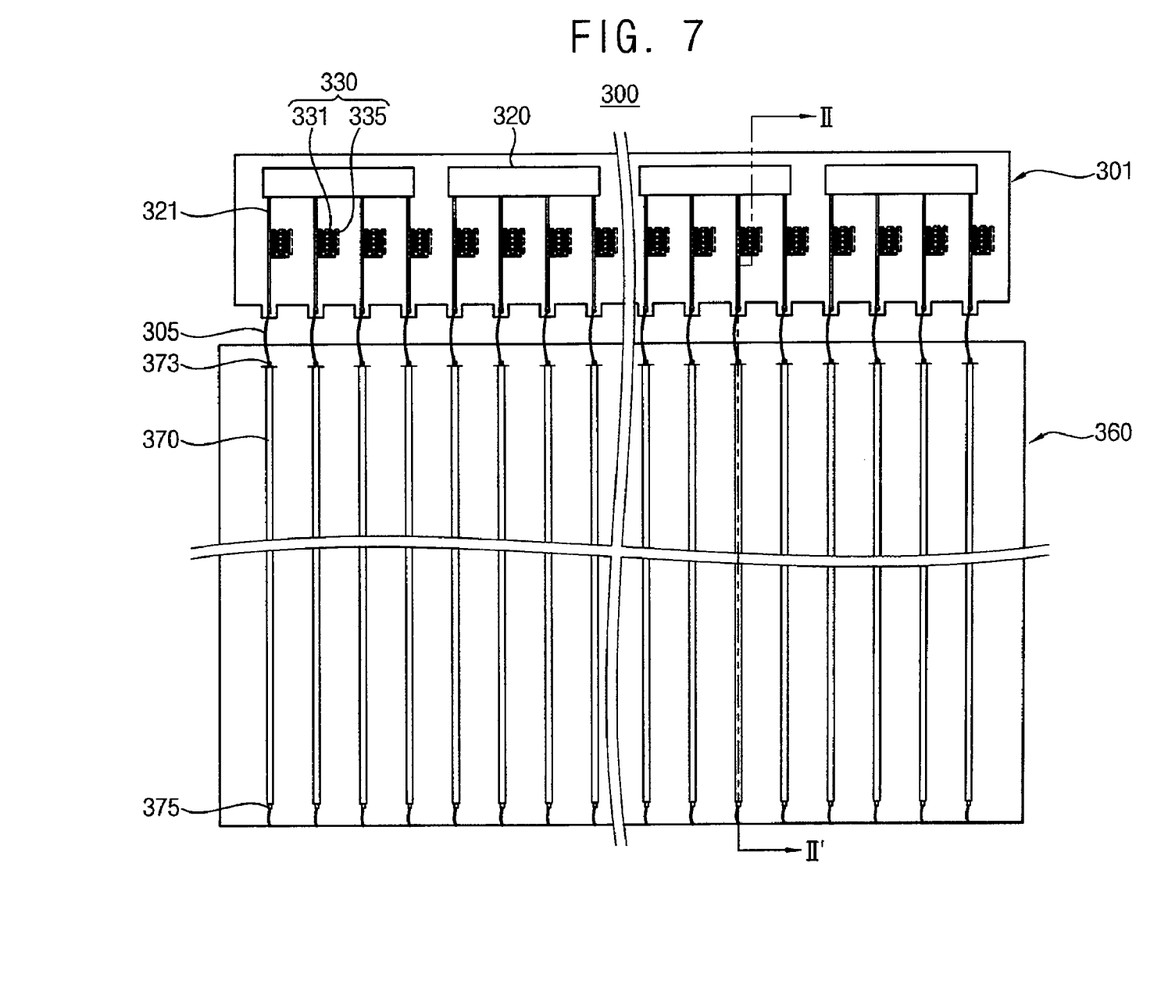
FIG. 7 is a plan view illustrating a backlight assembly in accordance with an embodiment of the present invention.

FIG. 7 is a plan view illustrating a backlight assembly in accordance with an embodiment of the present invention.

Figure 8:
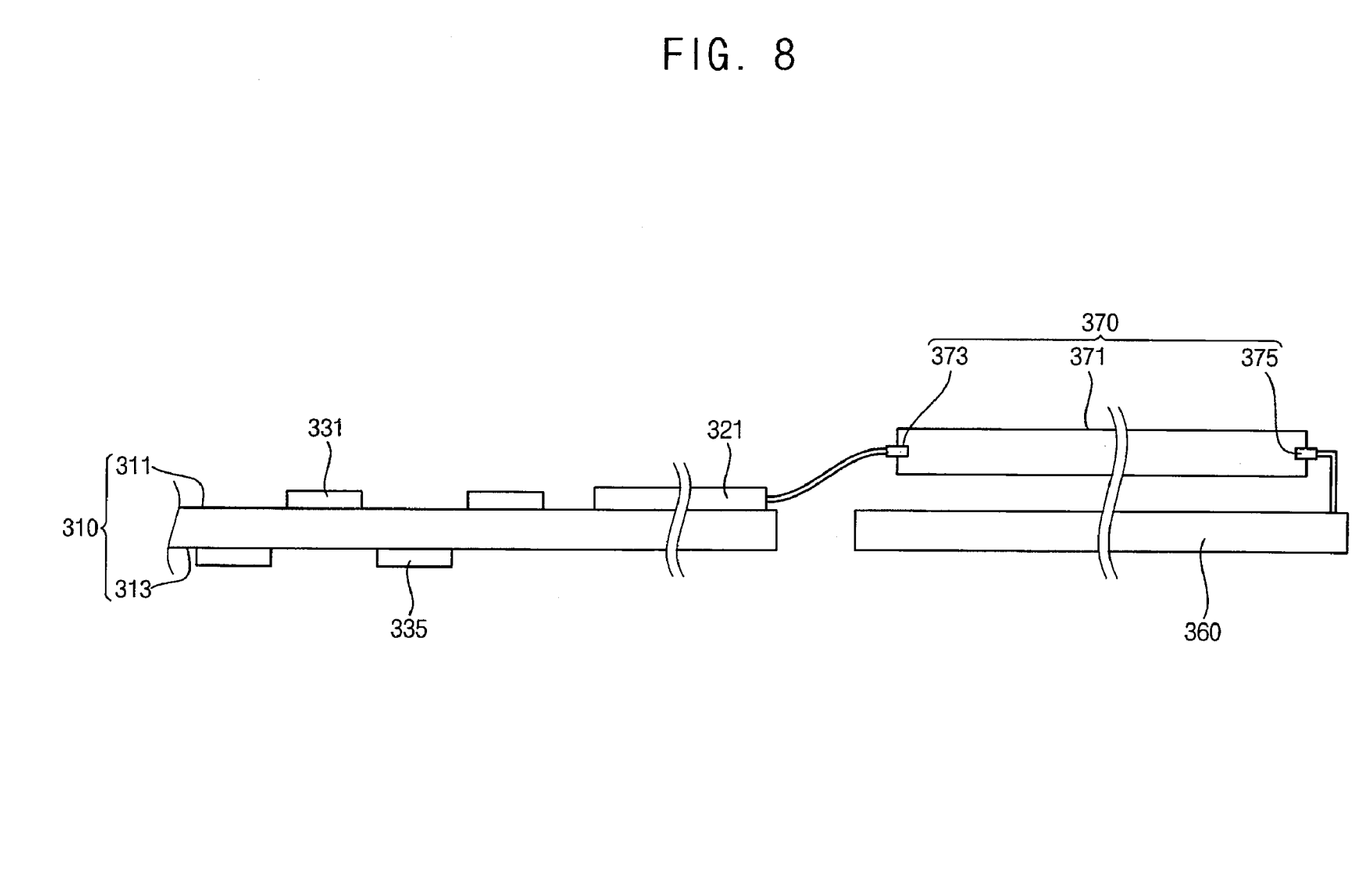
FIG. 8 is a cross-sectional view illustrating the backlight assembly taken along a line II-II' in FIG. 7.

FIG. 8 is a cross-sectional view illustrating the backlight assembly taken along a line II-II' in FIG. 7.

Referring to FIGS. 7 and 8, a backlight assembly 300 includes a plurality of lamps 370 and a voltage supply module 301.

The lamps 370 are disposed to be parallel with each other. A lamp 370 may include a lamp tube 371, a first terminal 373 and a second terminal 375.

Discharge gas is included in the lamp tube 371 and a fluorescent layer is applied to an inner surface of the lamp tube 371. The lamp tube 371 may be a glass tube of a straight type.

The first and second terminals 373 and 375 may be disposed on opposite ends of the lamp tube 371. The first and second electrodes 331 and 335 may be disposed on the interior of both the end portions of the lamp tube 371, respectively, or on outside surface of both the end portions of the lamp tube 371.

The backlight assembly 300 may further include a container 360 which houses the lamps 370.

The voltage supply module 301 is disposed on the exterior of the container 360 and applies lamp driving voltage to the lamps. The voltage supply module 301 is substantially the same as the voltage supply module 100 illustrated in FIGS. 1 to 6. Thus, the voltage supply module 301 includes the board 310, a plurality of the converters 320 and a plurality of the capacitors 330. The capacitor 30 includes the first electrodes 331 and the second electrodes 335.

The board 310 may be disposed on a bottom plate or a side wall of the container 360.

The converter 320 is disposed on the board 310 and boosts the basic input voltage into the driving voltage. The capacitor 30 may stabilize boosted driving voltage so that the driving voltage is converted into the lamp driving voltage. For example, four first electrodes 331 which are connected to output lines 321, respectively, are electrically connected in parallel with each of the converters 320.

The output lines 321 electrically connect the converter 320 with the first terminal 373 of the lamp. The lamp driving voltage is applied to the first terminal 373 through the output lines 321. Thus, each of the converters 320 may be electrically connected in parallel with four lamps.

Figure 9:
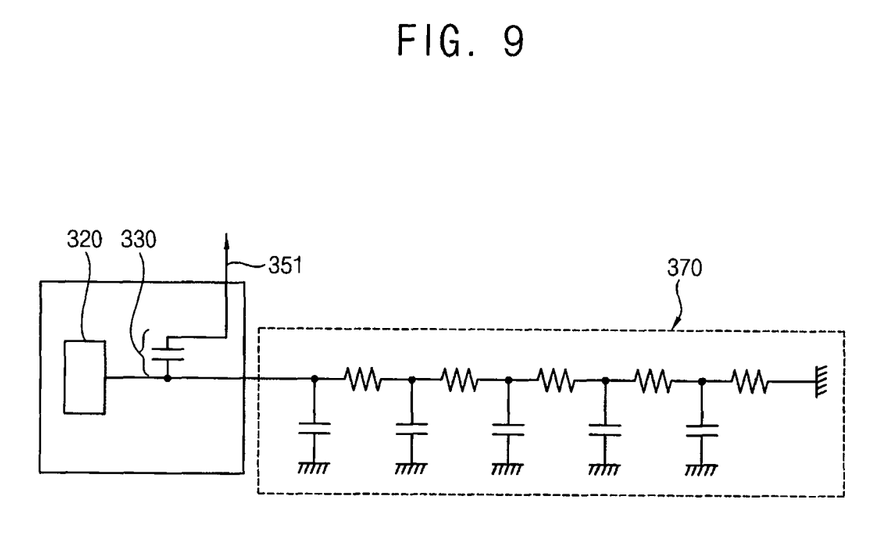
FIG. 9 is an equivalent circuit diagram for the backlight assembly in FIG. 7.

FIG. 9 is an equivalent circuit diagram for the backlight assembly 300 in FIG. 7.

Referring to FIG. 9, the lamp tube 370 may be viewed as a combination of a plurality of resistors and capacitors. The second terminal 375 of the lamp 370 may be grounded with the container 360 so that the voltage of the second terminal 375 may be 0 V. In other words, in this example embodiment, the lamps 370 are driven by the one-side driving method so that the lamp driving voltage is only applied to the first terminal 373 of the lamp.

Alternatively, the lamps 370 can be driven by the both-side driving method. For example, another voltage supply module 301 may be disposed adjacent to the second terminal 375 and apply lamp driving voltage to the second terminal 375.

As shown in FIG. 8, the second electrodes 335 are disposed on the second face 313 of the board 310 between the first electrodes 331. The connection electrode electrically connects the second electrodes 335 with each other.

The sensing line 351 is connected to the second electrode 335 so that the sensing line 351 may be electrically connected to the protection circuit.

The driving voltage applied to the first electrode 331 may be AC voltage. An induced voltage having a phase difference of 180 degrees with respect to the driving voltage may be formed in the second. The induced voltage may include signals related to the voltage of the driving voltage applied to the first electrode 331. The signals related to the voltage of the driving voltage may include signals related to a waveform of the driving voltage, etc.

Thus, the sensing line 351 may transmit the signals related to the driving voltage to the protection circuit. The protection circuit may protect the voltage supply module 301 on the base of the signals related to the driving voltage.

In accordance with example embodiment, an additional element such as a ceramic capacitor for forming the ballast capacitance or feeding back the signals related to the driving voltage may be omitted from the voltage supply module 301.

Also, the insulation breakdown voltage on which the corona discharge may occur at the first electrode 331 may become higher than the discharge voltage of the lamp. Thus, the electrical stability of the backlight assembly 300 may be much improved so that the backlight assembly 300 may be suitable for a high voltage driving of the backlight assembly 300 according to a trend of larger sizes and the one-side driving.

Figure 10:
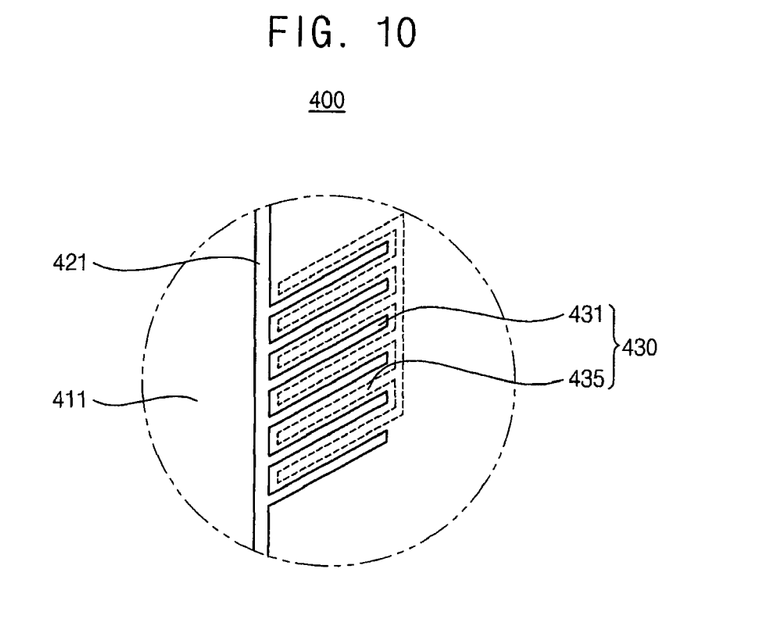
FIG. 10 is a plan view illustrating a voltage supply module in accordance with another example embodiment.

FIG. 10 is a plan view illustrating a voltage supply module 400 in accordance with another example embodiment.

Referring to FIG. 10, the voltage supply module 400 is substantially the same as the voltage supply module 100 illustrated in FIGS. 1 to 6, except for the shape of a capacitor 430.

In the present embodiment, the first electrodes 431 are disposed on the first face 11 of the board to make an acute angle with an output line 421. The second electrodes 435 are disposed on the second face of the board between the first electrodes 431 and are substantially parallel with each other.

In accordance with example embodiment, the width of the capacitor 430 may be decreased.

A backlight assembly according to this embodiment is substantially the same as the backlight assembly 300 illustrated in FIGS. 7 to 9, except for including the voltage supply module 400 illustrated in FIG. 10. Thus, further description of the backlight assembly is not necessary.

Figure 11:
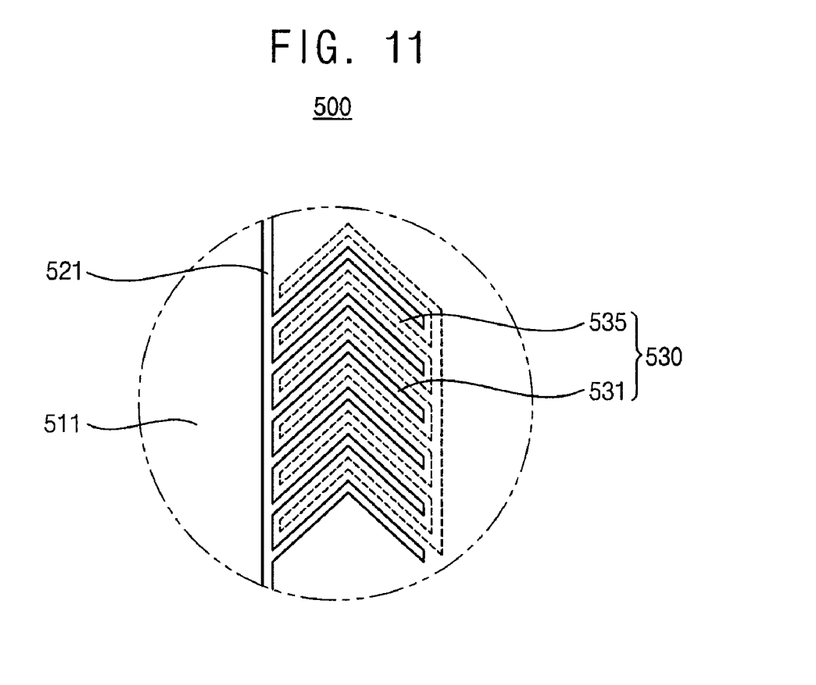
FIG. 11 is a plan view illustrating a voltage supply module in accordance with still another example embodiment.

FIG. 11 is a plan view illustrating a voltage supply module 500 in accordance with still another example embodiment.

Referring to FIG. 11, the voltage supply module 500 is substantially the same as the voltage supply module 100 illustrated in FIGS. 1 to 6, except for the shape of a capacitor 530.

In the present embodiment, the first electrodes 531 extend from a side face of an output line 521. Each of the first electrodes 531 has a V-shape. The first electrodes 531 are disposed on the first face 311 of the board along a first direction substantially parallel with the output line 521. The second electrodes 535 are disposed on the second face of the board between the first electrodes 531. Each of the second electrodes 535 has a V-shape. The second electrodes 535 are disposed on the second face along the first direction.

In accordance with example embodiment, the length and the area of the first or the second electrodes 535 corresponding to each other may be increased so that the ballast capacitance may be increased.

A backlight assembly according to this embodiment is substantially the same as the backlight assembly 300 illustrated in FIGS. 7 to 9, except for including the voltage supply module 500 illustrated in FIG. 11. Thus, further description of the backlight assembly is unnecessary.

Figure 12:
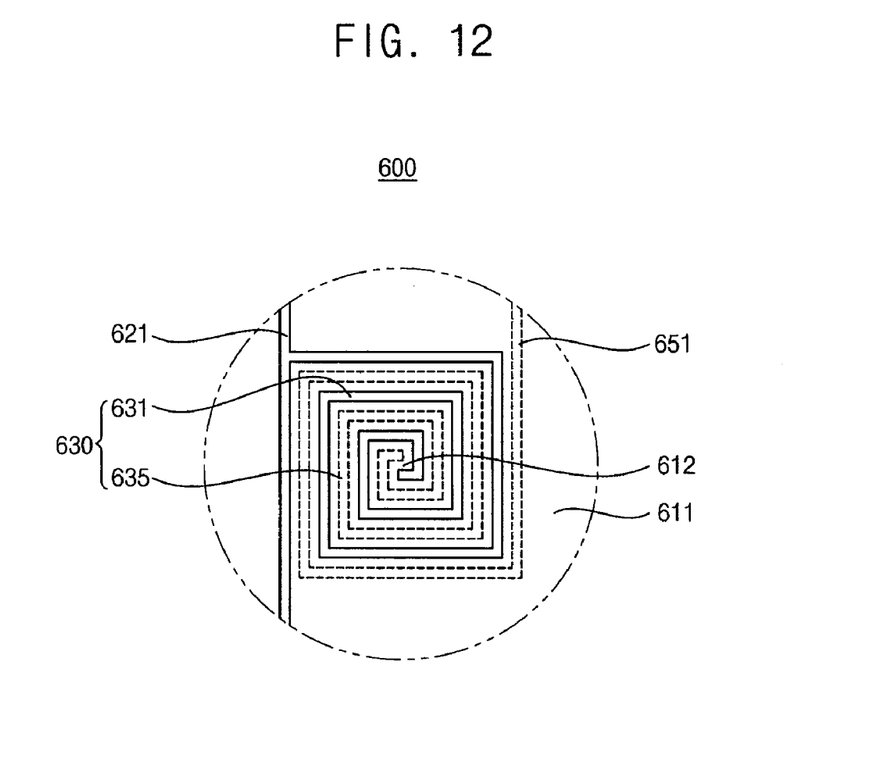
FIG. 12 is a plan view illustrating a voltage supply module in accordance with further still another example embodiment.

FIG. 12 is a plan view illustrating a voltage supply module 600 in accordance with further still another example embodiment.

Referring to FIG. 12, the voltage supply module 600 is substantially the same as the voltage supply module 100 illustrated in FIGS. 1 to 6, except for the shape of a capacitor 630.

In the present embodiment, one first electrode 631 extends from one output line 621. Alternatively, a plurality of first electrodes 631 may extend from one output line 621.

The first electrode 631 extends from the output line 621 to turn around a center of rotation defined on the first face 611 so that an end portion of the first electrode 631 approaches the center of rotation. Thus, the first electrode 631 may be formed in the shape of a spiral.

The second electrode 635 may be formed in the shape of a spiral like the first electrode 631. The second electrode 635 extends to turn around the center of rotation so that an end portion of the second electrode 635 approaches the center of rotation.

In accordance with example embodiment, the length of the first or the second electrodes 635 corresponding to each other may be more increased so that the ballast capacitance may be more increased.

A backlight assembly according to this embodiment is substantially the same as the backlight assembly 300 illustrated in FIGS. 7 to 9, except for including the voltage supply module 600 illustrated in FIG. 12. Thus, further description of the backlight assembly is not needed.

Figure 13:
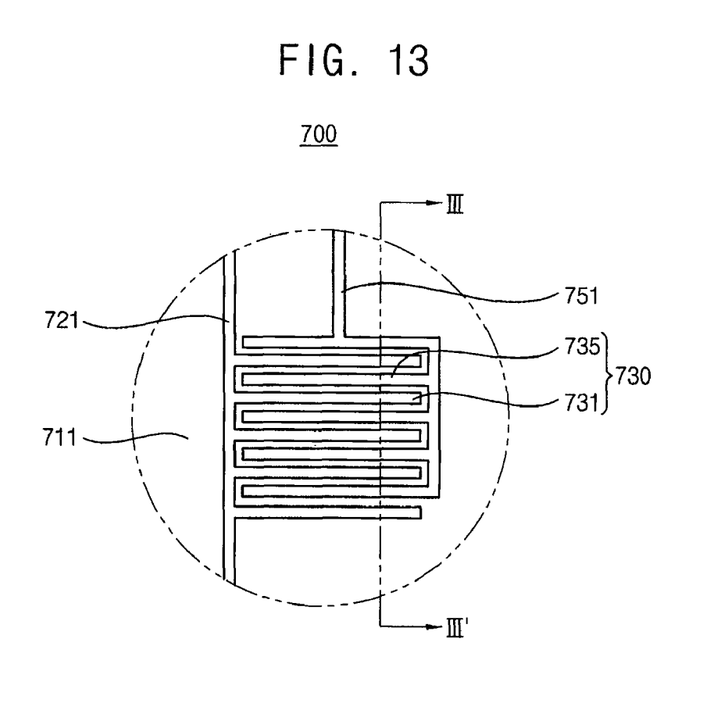
FIG. 13 is a plan view illustrating a voltage supply module in accordance with further still another example embodiment.
Figure 14:
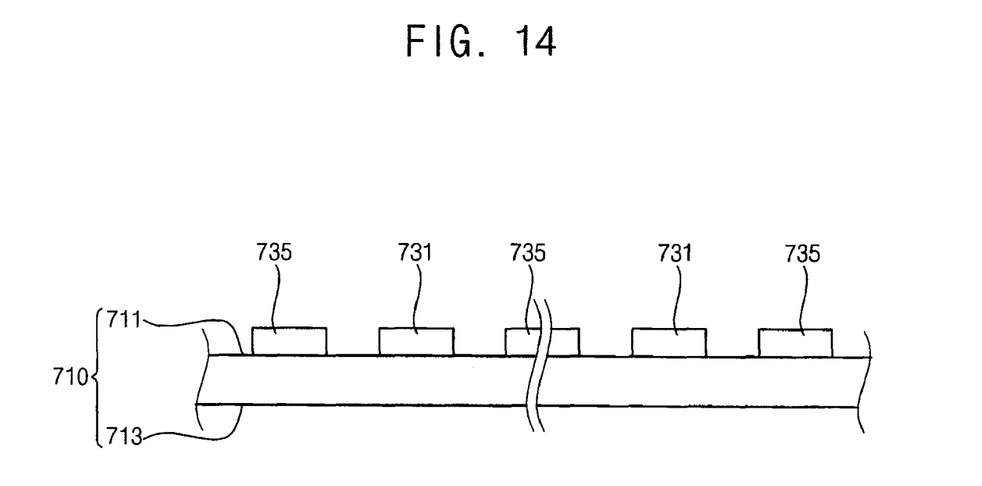
FIG. 14 is a cross-sectional view illustrating the voltage supply module taken along a line III-III' in FIG. 13.

FIG. 13 is a plan view illustrating a voltage supply module 700 in accordance with further still another example embodiment. FIG. 14 is a cross-sectional view illustrating the voltage supply module 700 taken along a line III-III' in FIG. 13.

Referring to FIGS. 13 and 14, the voltage supply module 700 is substantially the same as the voltage supply module 100 illustrated in FIGS. 1 to 6, except for the position of the second electrodes 735.

In the present embodiment, the first electrodes 731 are disposed on the first face 711 and the second electrodes 735 are also disposed on the first face 711 so as not to contact the first electrodes 731.

The first electrodes 731 extend from the output line 721 and are substantially parallel with each other along a direction substantially perpendicular to an extension direction of the output line 721. The second electrodes 735 are disposed between the first electrodes 731 and are substantially parallel with each other. The sensing line 751 is connected to the second electrodes 735 with each other and is electrically connected to the protection circuit.

The first and second electrodes 731 and 735 are spaced apart from each other. Air and the board 710 are disposed between the first and second electrodes 731 and 735. Thus, a first capacitance may be formed by the first electrode 731, the air and the second electrode 735 and a second capacitance may be formed by the first electrode 731, the board 710 and the second electrode 735. As a result, the ballast capacitance may be formed by a combination of the first and second capacitances.

When the horizontal distance between adjacent edges of the first and second electrodes 731 and 735 is increased, the insulation breakdown voltage of the voltage supply module 700 may be greatly increased.

In the example embodiment as illustrated in FIGS. 13 and 14, the first and second electrodes 731 and 735 are disposed on the first face 711. Thus, the insulation breakdown voltage of the voltage supply module 700 in this embodiment may be lower than the insulation breakdown voltage of the voltage supply module 100 illustrated in FIGS. 1 to 6.

In this embodiment, however, a one-face PCB may be used as a board 710 and metal linear patterns such as the first and second electrodes 731 and 735 are formed on only one face of the one-face PCB so that the costs for the voltage supply module 700 may be greatly decreased.

A backlight assembly according to this embodiment is substantially the same as the backlight assembly 300 illustrated in FIGS. 7 to 9, except for including the voltage supply module 700 illustrated in FIGS. 13 and 14. Thus, further description of the backlight assembly is not necessary.

According to the voltage supply module and the backlight assembly having the same, a ballast capacitance is formed by linear patterns such as the first and second electrodes so that an additional element such as a ceramic capacitor for forming the ballast capacitance and feeding back may be omitted.

Also, the first and second electrodes are spaced apart from each other along the horizontal direction so that the insulation breakdown voltage of the first and second electrodes may be much higher than the discharge voltage of the lamp. As a result, the electrical stability of the voltage supply module may be much improved and the electrical stability of the backlight assembly, which is driven by high voltage according to trends of one-side driving and larger module sizes, may also be improved.

Thus, the voltage supply module and the backlight assembly in accordance with the present invention may be used in a driving module for driving a light source of the display device.

The foregoing is illustrative of the present invention and is not to be construed as limiting thereof. Although example embodiments of the present invention have been described, those skilled in the art will readily appreciate that many modifications of the example embodiments are possible without materially departing from the novel teachings and advantages of the present invention. Accordingly, all such modifications are intended to be included within the scope of this invention as defined in the claims. It is to be understood that the foregoing is illustrative of the present invention and is not to be construed as limited to the embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A voltage supply module for providing at least a lamp driving voltage to at least a lamp, the voltage supply module comprising:
    a board comprising a first face and a second face opposite the first face;
    a converter operative to convert an externally provided first voltage into a second voltage; and
    a capacitor comprising:
        a plurality of first electrodes disposed on the first face, the first electrodes being connected to an output line of the converter; and
        a plurality of second electrodes disposed on the first face or the second face, the second electrodes being interspersed between the first electrodes in a plan view of the voltage supply module, the second electrodes being spaced apart from the first electrodes along a plane substantially parallel with a plane of the first face.

2. The voltage supply module of claim 1, wherein the second electrodes are disposed on the second face.

3. The voltage supply module of claim 2, wherein
    the first electrodes extend from the output line,
    end portions of the second electrodes are electrically connected with each other, and the second electrodes extend toward the output line and are disposed substantially parallel with each other.

4. The voltage supply module of claim 2, further comprising a sensing line disposed on the second face and electrically connected to the second electrodes, the sensing line transmitting sensing signals including signals corresponding to a waveform of a driving voltage to a protection circuit for protecting the voltage supply module, the driving voltage being applied to the first electrodes through the output line of the converter.

5. The voltage supply module of claim 1, wherein the first electrodes and the second electrodes extend along a straight line.

6. The voltage supply module of claim 1, wherein the first electrodes and the second electrodes are bent and extend substantially parallel with each other.

7. The voltage supply module of claim 1, wherein the second electrodes are disposed on the first face.

8. The voltage supply module of claim 7, further comprising a sensing line disposed on the first face and electrically connected to the second electrodes, the sensing line transmitting sensing signals including signals corresponding to the state of a driving voltage to a protection circuit for protecting the voltage supply module, the driving voltage being applied to the first electrodes through the output line of the converter.

9. The voltage supply module of claim 1, wherein a plurality of output lines extends from the converter, and the capacitor is electrically connected to each of the output lines.

10. The voltage supply module of claim 9, wherein the voltage supply module comprises a plurality of converters.

11. A backlight assembly, comprising:
a lamp comprising a lamp tube, the lamp further comprising a first terminal and a second terminal disposed on the lamp tube; and
a voltage supply module for providing at least a lamp driving voltage to at least the lamp, the voltage supplying module comprising:
  a board comprising a first face and a second face opposite the first face;
  a converter operative to convert an externally provided first voltage into a second voltage; and
  a capacitor comprising:
    a plurality of first electrodes disposed on the first face, the first electrodes being connected to an output line of the converter; and
    a plurality of second electrodes disposed on the first face or the second face, the second electrodes being interspersed between the first electrodes in a plan view of the voltage module, the second electrodes being spaced apart from the first electrodes along a plane substantially parallel with a plane of the first face.

12. The backlight assembly of claim 11, wherein the second terminal is grounded.

13. The backlight assembly of claim 11, wherein the backlight assembly comprises a plurality of lamps electrically connected to a plurality of output lines, respectively, and the capacitor is electrically connected in parallel with each of the output lines.

14. The backlight assembly of claim 11, wherein the first electrodes of the capacitor of the voltage supply module are electrically connected in parallel with the output line, and the second electrodes of the capacitor of the voltage supply module are disposed to alternate with the first electrodes of the capacitor of the voltage supply module.

15. The backlight assembly of claim 11, wherein the second electrodes of the capacitor of the voltage supply module are disposed on the second face and are disposed between the first electrodes of the capacitor of the voltage supply module in the plan view of the voltage module.

16. The backlight assembly of claim 11, wherein the second electrodes of the capacitor of the voltage supply module are disposed on the first face and are disposed between the first electrodes of the capacitor of the voltage supply module.

17. The backlight assembly of claim 11, wherein each of the first electrodes of the capacitor of the voltage supply module extends from the output line and is bent to have a V-shape, and each of the second electrodes of the capacitor of the voltage supply module is disposed between the first electrodes and is V-shaped in the plan view of the voltage module.

18. The backlight assembly of claim 11, wherein at least one of the first electrodes of the capacitor of the voltage supply module spirals around a center defined on the first face so that an end portion of the at least one of the first electrodes of the capacitor of the voltage supply module approaches the center, and at least one of the second electrodes of the capacitor of the voltage supply module spirals around the center without overlapping with the at least one of the first electrodes of the capacitor of the voltage supply module, an end portion of the at least one of the second electrodes of the capacitor of the voltage supply module approaching the center.

19. The backlight assembly of claim 11, wherein the voltage supply module further comprises a sensing line electrically connected to the second electrodes, the sensing line transmitting sensing signals including signals corresponding to the state of the lamp driving voltage to a protection circuit for protecting the backlight assembly.

* * * * *